United States Patent
Matsumoto

(10) Patent No.: US 6,476,369 B1
(45) Date of Patent: Nov. 5, 2002

(54) LINEAR LIGHT SOURCE WITH INCREASED LIGHT EFFICIENCY AND UNIFORM EXPOSURE, AND IMAGE SENSOR USING THE LINEAR LIGHT SOURCE

(75) Inventor: Toshio Matsumoto, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/539,439

(22) Filed: Mar. 30, 2000

(30) Foreign Application Priority Data

Oct. 7, 1999 (JP) ............................................ 11-287134

(51) Int. Cl.⁷ ............................................ H01L 27/00
(52) U.S. Cl. ................................... 250/208.1; 358/475
(58) Field of Search ............................... 250/208.1, 552, 250/553, 234, 235; 358/483, 494, 496, 497, 475; 362/800, 545

(56) References Cited

U.S. PATENT DOCUMENTS

| 4,970,606 A | * 11/1990 | Shima ........................ 358/474 |
| 5,182,445 A | 1/1993 | Yamashita |
| 5,489,992 A | 2/1996 | Endo |
| 5,670,971 A | * 9/1997 | Tokimoto et al. ............. 345/31 |
| 5,926,286 A | * 7/1999 | Fujieda ........................ 358/474 |
| 6,160,250 A | * 12/2000 | Miksch et al. ......... 235/462.45 |

FOREIGN PATENT DOCUMENTS

| JP | Sho 61-136369 | 6/1986 |
| JP | Hei 2-222583 | 9/1990 |
| JP | Hei 6-012920 | 2/1994 |
| JP | Hei 7-162586 | 6/1995 |
| JP | Hei 7-183478 | 7/1995 |
| JP | Hei 11-163409 | 6/1999 |

* cited by examiner

Primary Examiner—Stephone Allen
Assistant Examiner—Bradford Hill
(74) Attorney, Agent, or Firm—Rothwell, Figg, Ernst & Manbeck

(57) ABSTRACT

A linear light source is provided in which surface mounting type LED chips are arranged linearly on a circuit board. Each LED chip is given a light condensing function. The ratio between the arrangement interval of the adjacent LED chips and the distance from the LED chip to an exposure surface is determined according to the directivity characteristic of each LED chip and the following equation:

$$L(\theta)=L(0°)/(2 \cdot \cos^2\theta)$$

where $L(\theta)$ is exposure at an angle $\theta$, and $\theta$ is an angle with respect to a perpendicular to the exposure surface from a LED chip.

7 Claims, 7 Drawing Sheets

LINEAR LIGHT SOURCE WITH INCREASED LIGHT EFFICIENCY AND UNIFORM EXPOSURE, AND IMAGE SENSOR USING THE LINEAR LIGHT SOURCE

BACKGROUND OF THE INVENTION

1. Field of the Invention

The present invention relates to a linear light source of an image sensor that is used in an image input section of a facsimile apparatus etc. The present invention also relates to a contact image sensor having such a linear light source.

2. Background Art

FIGS. 9–11 show a conventional image sensor that is listed in the Mitsubishi contact image sensor catalogue (produced in February 1993), for example. FIG. 9 is a sectional view of the contact image sensor, FIG. 10 shows a linear light source of the contact image sensor, and FIG. 11 shows the directivity characteristic of each LED chip that is used in the linear light source of the contact mage sensor.

In FIG. 9, reference numeral 10 denotes an original document; 20, a linear light source in which LED chips are arranged linearly; 30, an erect 1:1 imaging rod lens array, or an erect-image, equimagnification imaging rod lens array, that is composed of a plurality of rod lenses (not shown); 40, a sensor board; 50, sensor ICs attached to the sensor board 40 so as to be arranged linearly; 60, a glass plate on a document running surface; 70, a sensor frame; and 80, a path of light that is output from the linear light source 20 and imaged on the sensor ICs 50.

In FIG. 10, reference numeral 90 denotes a LED bare chip; 100, substrate that is mounted with the respective LED bare chip 90; and 110, a resin body with which the respective LED bare chip 90 is sealed. The surface of each resin body 110, from which light generated by the corresponding LED bare chip 90 is emitted, is flat. An LED bare chip 90, a substrate 100, and a resin body 110 constitute a surface mounting type LED chip 120. Reference numeral 130 denotes a circuit board on which a plurality of LED chips 120 are mounted linearly. The plurality of LED chips 120 and the circuit board 130 constitute an LED array linear light source 20. Reference numeral 140 denotes an exposed surface (document surface) that is illuminated by the LED chips 120; 150, the distance between adjacent LED chips 120; 160, paths of light that spreads radially from each LED chip 120; 170, the distance between each LED bare chip 90 and the document surface 140; 180, an exposure profile of one chip that is obtained when the illumination surface 140 is illuminated by light coming from each LED chip 120; and 190, a total exposure profile as the sum of exposure profile 180 of each chip.

Next, the operation will be described with reference to FIGS. 9–11. Light that is output from the linear light source 20 passes through the glass plate 60 and illuminates the original document 10 uniformly. The exposed light is reflected by the original document 10 in accordance with light-and-shade information of an image and goes along the path 80 of light. The reflected light passes through the rod lenses of the rod lens array 30 and is imaged on the sensor ICs 50. The sensor ICs 50 accumulate charges in accordance with the intensity of the reflected light and outputs signals via the sensor board 40. The linear light source 20 is realized by arranging the point light sources of LED chips 120, and is composed of the LED bare chips 90, the substrates 100, the resin bodies 110, and the circuit board 130. Each LED chip 120 has a wide directivity characteristic as shown in FIG. 11, and the exposure profile 180 on the document surface is somewhat convex. The total exposure profile 190 as superimposition of the exposure profiles 180 assumes a flat line.

The conventional linear light source is configured in the above-described manner, and each LED chip 120 has the wide directivity characteristic as shown in FIG. 11. Although the directivity characteristic of FIG. 11 is the one taken along the surface of the drawing of FIG. 10, each LED chip 120 exhibits approximately the same directivity characteristic in the direction perpendicular to the surface of the drawing of FIG. 10. As for the exposure in the direction perpendicular to the surface of the drawing, it is more efficient to illuminate a reading position in a concentrated manner. However, conventionally, priority is given to uniform illumination of a document and the efficiency of light utilization is sacrificed in the direction perpendicular to the surface of the drawing of FIG. 10.

SUMMARY OF THE INVENTION

The present invention has been made to solve the above problems in the art, and an object of the invention is therefore to provide a linear light source that has a uniform exposure characteristic and is superior in efficiency of light utilization.

According to one aspect of the present invention, a linear light source comprises a circuit board and a plurality of LED chips arranged linearly on the circuit board, and each of the LED chips has a light condensing function.

In another aspect, in the linear light source, an arrangement interval between the adjacent LED chips is preferably shorter than or equal to a distance between the LED chips and a document exposure surface.

In another aspect, in the linear light source, a ratio between the interval of the adjacent LED chips and the distance from the LED chips to the document exposure surface is preferably determined according to a directivity characteristic of each of the LED chips and an equation $$L(\theta)=L(0°)/(2\cdot\cos^2\theta)$$

where $L(\theta)$ is exposure at an angle $\theta$, and $\theta$ is an angle with respect to a perpendicular to the document exposure surface from the LED chips.

Other and further objects, features and advantages of the invention will appear more fully from the following description.

BRIEF DESCRIPTION OF THE DRAWINGS

FIG. 7A is a side view and FIGS. 7B and 7C are plan views.

DETAILED DESCRIPTION OF THE PREFERRED EMBODIMENTS

Figure 1:
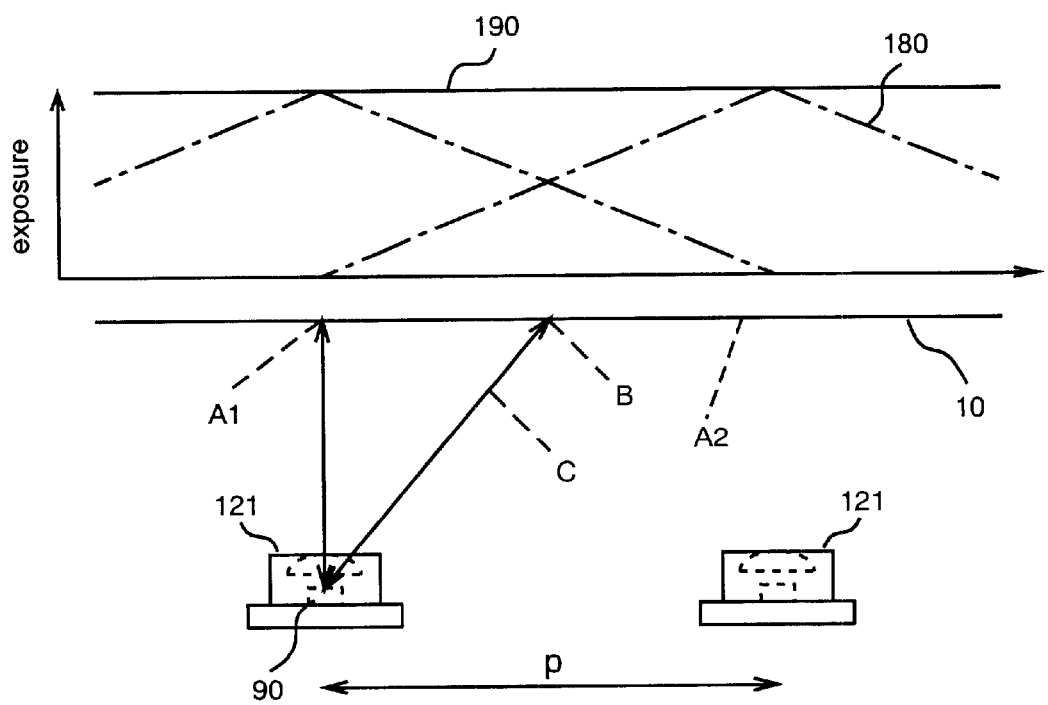
FIG. 1 shows a structure and function of a linear light source according to a first embodiment of the present invention.

Preferred Embodiments of the present invention will be described with reference to the accompanying drawings, in which same or corresponding elements are indicated by the same reference numerals.
First Embodiment A first embodiment of the present invention will be described below with reference to FIGS. 1–5. FIG. 1 shows the main part of a linear light source according to this embodiment. In FIG. 1, reference numeral 10 denotes a document exposure surface or a position of an original document to be exposed. Reference numeral 121 denotes a plurality of LED chips that are arranged in line so as to be opposed to the original document 10. Each LED chip 121 is associated with a lens included therein. Hereinafter, a LED chip 121 including a lens is called as a lens-associated LED chip in this specification. FIG. 1 shows two of those LED chips 121. Reference numeral 90 denotes an LED bare chip that is incorporated in each LED chip 121.

Now, the points on the original document 10 that is positioned just above the respective LED chips 121 are denoted by A1 and A2 and the middle point between points A1 and A2 is denoted by B. Point A1 is a brightest point on the original document and point B is a darkest point. Therefore, it is assumed that a uniform exposure profile is obtained if points A1 and B have the same brightness. If a exposure profile 180 of a single LED chip 121 is as shown in FIG. 1 and if the exposure at point A1 is highest and the exposure at point B is a half of that at point A1, a exposure profile 190 that is the sum of the exposure profiles 180 of the adjacent LED chips 121 becomes uniform. Let LA1 and LB represent exposure levels at points A1 and B that are caused by the left-hand LED chip 121 in FIG. 1. Then, LA1 and LB have the following relationship:

$$LA1 = 2 \cdot LB \quad (1)$$

As shown in FIG. 1, the distance between the left-hand LED bare chip 90 and point A1 is represented by Da, the distance between the left-hand LED bare chip 90 and point B is represented by Db, the angle subtended by line segment A1–B is represented by θ, the distance between the adjacent LED chips 121 is represented by Dp, and the point that is located on the straight line connecting the left-hand LED bare chip 90 and point B and that is distant from the left-hand bare chip 90 by Da is denoted by C. Since the exposure of light that spreads radially is in inverse proportion to the square of the distance, brightness LC at point C is given by $$a^2 LC = b^2 \cdot LB \quad (2)$$

Since a=b·cosθ, Equation (2) is modified as follows:

$$b^2 \cdot \cos^2\theta \cdot LC = b^2 \cdot LB$$

$$LB = LC \cdot \cos^2\theta \quad (3)$$

From Equations (1) and (3), $$LC = LA1/(2 \cdot \cos^2\theta) \quad (4)$$

Figure 2A:
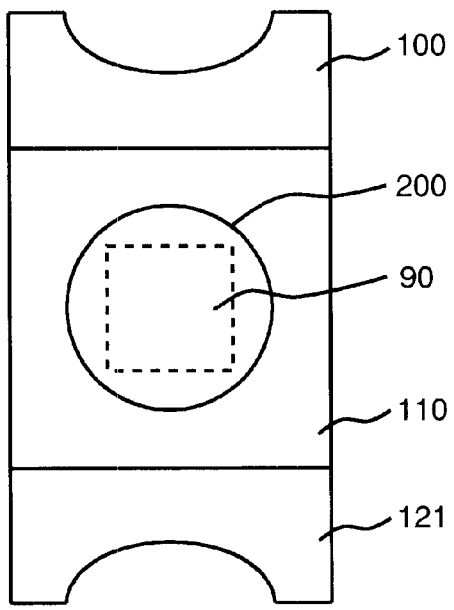
FIGS. 2A and 2B show a front view and side view of a LED chip used in the first embodiment.
Figure 2B:
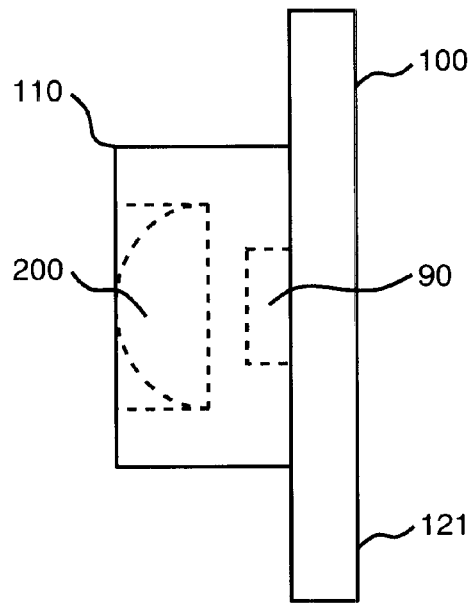
Figure 3:
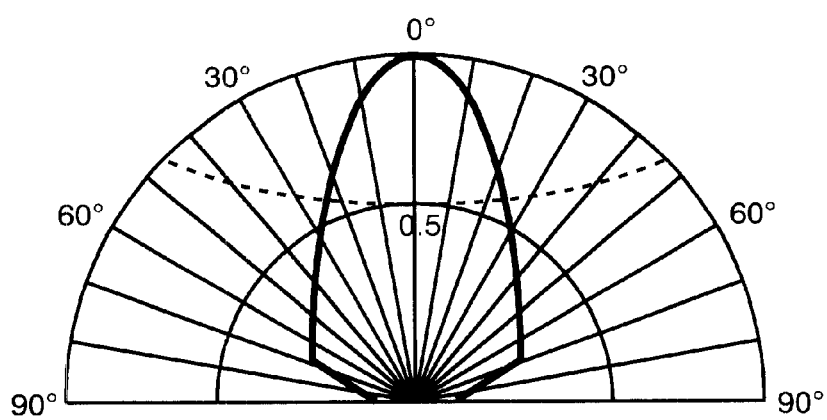
FIG. 3 shows a directivity characteristic of emitted light of a LED chip used in the first embodiment.

For example, each LED chip 121 having lens shown in FIG. 1 is configured as shown in FIGS. 2A–2B and FIG. 3 (i.e. a lens-associated LED chip manufactured by Stanley Electric Co., Ltd., type name PY1102W, LED catalogue issued in January 1998). FIGS. 2A and 2B show an appearance and FIG. 3 shows a directivity characteristic of emitted light. In FIGS. 2A (plan view) and 2B (side view), reference numeral 100 denotes a substrate, and numeral 200 denotes a lens for light condensation that is included in a resin body 110.

In FIG. 3, the solid line represents the directivity characteristic of each LED chip 121. The reason why the directivity characteristic is sharp in shape is due to the presence of the lens 200. The broken line is a line according to Equation (4). The intersection of the solid line and the broken line in FIG. 3 corresponds to the angle θ that is formed by each lens-associated LED chip 121, when a plurality of lens-associated LED chips 121 shown in FIGS. 2A and 2B are arranged in line. The angle θ is approximately equal to 26°. In FIG. 1, if θ=26°, Dp is calculated as 5.9 mm when Da=6 mm, for example. It is expected in this case that a flat exposure profile will be obtained as indicated by the line 190.

Figure 4:
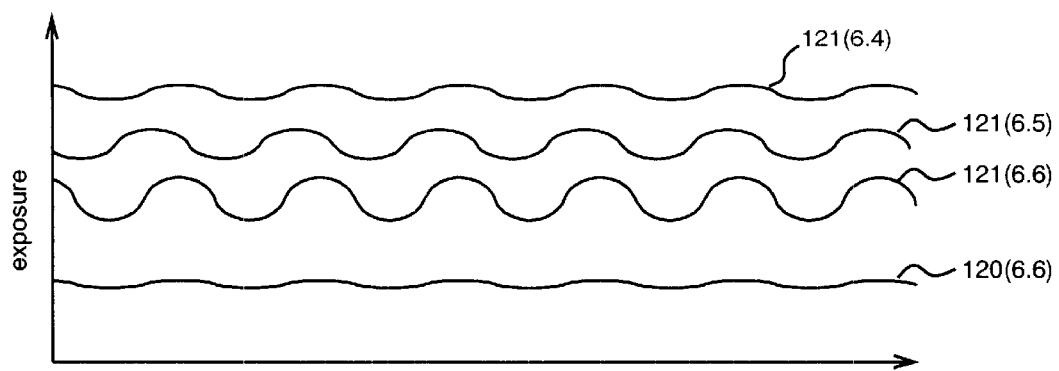
FIG. 4 shows experimental results of the uniformity of the exposure of the linear light source in the first embodiment.
Figure 11:
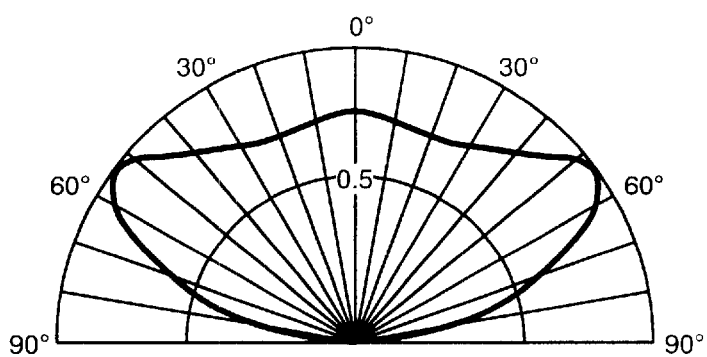
FIG. 11 shows a directivity characteristic of a LED chip used in the linear light source of the conventional contact mage sensor.

FIG. 4 shows experimental results in which the lens-associated LED chips 121 shown in FIGS. 2A and 2B were used with settings of Da =6 mm and Dp=4 mm, 5 mm, and 6 mm as well as an experimental result in which the conventional LED chips 120 shown in FIG. 11 were used with a setting of Da=6 mm and Dp=6 mm. The relationship (Da, Dp)=(6, 5.9) is obtained as a result of the calculation in which the exposure profile 190 is assumed flat in the ideal case. However, actually, the exposure profile deviates in the interval between the lens-associated LED chips 121 because of variations in the light quantity and the directivity characteristic of each lens-associated LED chip 121, and because of the fact that light is obliquely incident on point B, and conditions relating to the reflection, refraction, etc. of light that is applied to the glass plate 60.

However, in using output light of the contact image sensor, there is provided a means for compensating for variations in a certain range by the linear light source 20, the rod lens array 30, and the sensor ICs 50. Therefore, deviations of the degrees shown in FIG. 4 are not problematic. As is understood from FIG. 4, if only the interval between the LED chips 121 is determined properly, a light source capable of producing higher exposure can be obtained by using the lens-associated LED chips 121 than by using the conventional LED chips 120.

As described above, in the first embodiment of the invention, the lens-associated LED chips 121 are used and the mounting pitch of the lens-associated LED chips 121 is determined according to their directivity characteristic and Equation (4). As a result, a uniform exposure characteristic is obtained in the mounting direction of the lens-associated LED chips 121, and a lens effect is obtained in the direction perpendicular to the mounting direction. Thus, a linear light source that is superior in efficiency of light utilization can be provided.

Thus, in case of the lens-associated LED chips 121, the mounting pitch is properly set to be smaller than the distance from the lens-associated LED chips 121 to an exposed surface, i.e. the surface of the document 10.

One aspect of the present invention as described above may be summarized differently as follows. In the present invention, a plurality of LED chips 121 having vertical directivity in exposure profile are so arranged in line that an exposure on a document by one LED chip 121 at the middle point between a pair of adjacent LED chips 121 comes to be just half of the exposure by the same LED chip 121 on a document surface at a vertical direction from the same LED chip 121. In this way, the exposures by a plurality of LED chips are superposed and the overall uniform exposure is obtained on the document surface.

Figure 5A:
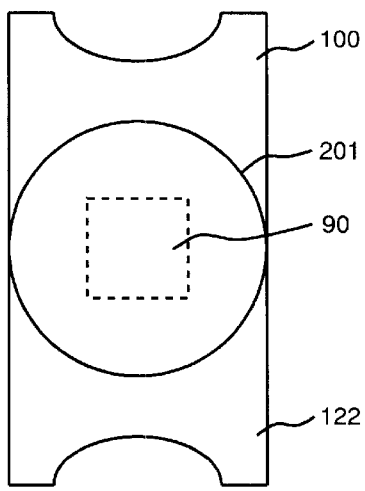
FIGS. 5A is a plan view and 5B is a side view of another LED chip used in the first embodiment.
Figure 5B:
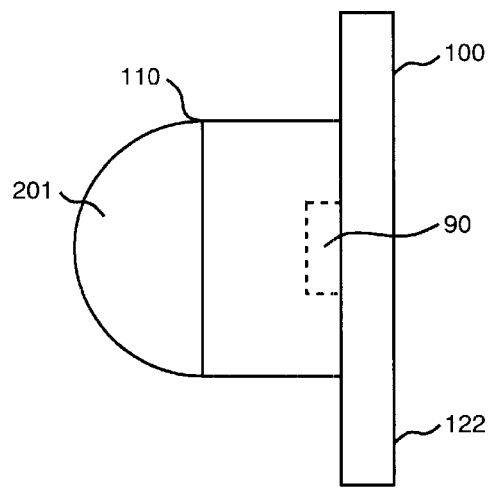

Although the lens-associated LED chips 121 having the shape shown in FIGS. 2A and 2B is used in the first embodiment of the present invention, lens-associated LED chips 122 having a shape shown in FIGS. 5A (plan view) and 5B (side view) may be used. Each lens-associated LED chip 122 has a lens 201 that projects from the top end of a resin body 110 that surrounds an LED bare chip 90. As a further alternative, LED chips each having a light condensing function that is based on a mechanism other than a lens may be used.

Second Embodiment

Figure 6:
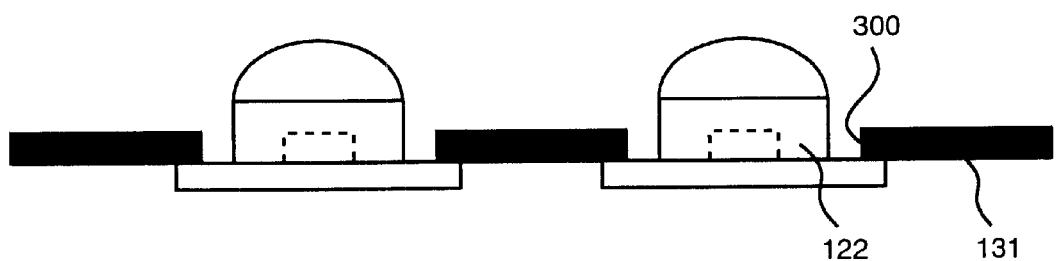
FIG. 6 shows a structure of a linear light source according to a second embodiment of the present invention.

Next, a second embodiment of the present invention will be described with reference to FIG. 6. In FIG. 6, reference numeral 131 denotes a circuit board having holes 300 so that lens-associated LED chips 122 can be mounted from the back side. In the other points, the linear light source according to this embodiment is configured in the same manner as that according to the first embodiment. By forming the holes 300 through the circuit board 131 and mounting the lens-associated LED chips 122 from the back side that is more distant from an original document 10, the lens-associated LED chips 122 can be located at positions that are more distant from the original document 10 and hence the mounting interval between the lens-associated LED chips 122 can be increased.

In the second embodiment, since the holes 300 are formed through the circuit board 131 and the lens-associated LED chips 122 are mounted from the back side, the number of lens-associated LED chips 122 can be reduced and an efficient, inexpensive light source can be obtained.

Third Embodiment

Figure 7A:
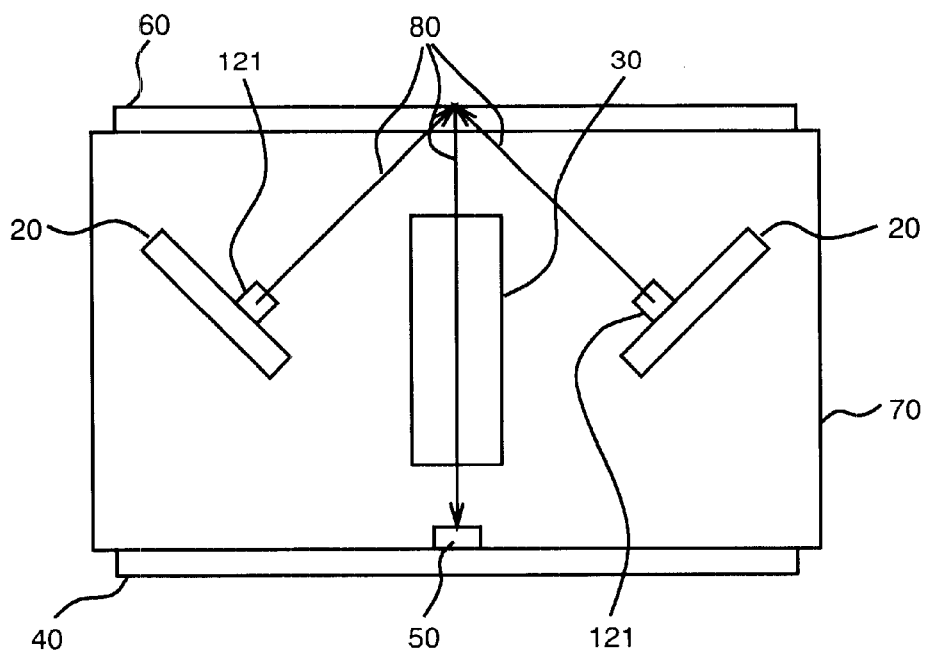
FIGS. 7A–7C show a structure of a contact image sensor according to a third embodiment of the present invention.
Figure 7B:
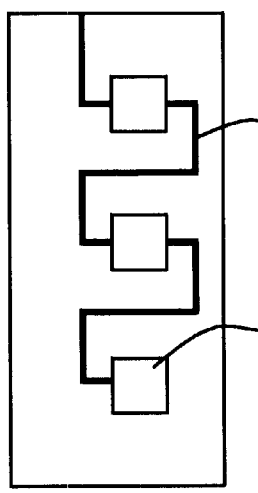
Figure 7C:
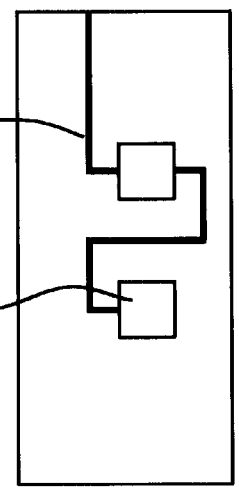

Next, a third embodiment of the present invention will be described with reference to FIGS. 7A–7C. FIG. 7A is a side view of a contact image sensor of the present embodiment, and FIGS. 7B and 7C are plan views showing its linear light sources. In FIGS. 7A–7C, reference numeral 20 denotes linear light sources in each of which LED chips 121 are arranged linearly; 30, an erect 1:1 imaging rod lens array, or an erect-image, equi-magnification imaging rod lens array, that is composed of a plurality of rod lenses (not shown); 40, a sensor board; 50, sensor ICs attached to the sensor board 40 so as to be arranged linearly; 60, a glass plate on a document running surface; 70, a sensor frame; 80, paths of light beams that are output from the linear light sources 20 and imaged on the sensor ICs 50; and 210, patterned interconnections formed on circuit boards of the linear light sources 20.

The linear light sources 20 are disposed symmetrically with respect to the rod lens array 30. Each lens-associated LED chip 121 of one linear light source 20 is located at a position symmetrical with the middle point or close to the middle point of the adjacent lens-associated LED chips 121 of the other linear light source 20. The patterned interconnection 210 on the circuit boards of the linear light sources 20 connect lens-associated LED chips 121.

As described above, in the third embodiment of the invention, the two linear light sources 20 are disposed so as to be symmetrical with respect to the rod lens array 30.

Further, each lens-associated LED chip 121 of one linear light source 20 is located at a position that is symmetrical with the middle point between adjacent lens-associated LED chips 121 of the other linear light source 20 or a point close to that middle point. Therefore, equivalently, the interval between the lens-associated LED chips 121 can be halved. This is effective in the case where lens-associated LED chips each having a sharp directivity characteristic are used and hence the mounting interval needs to be reduced but their arrangement interval can never be reduced to satisfy requirements relating to the width and the number of patterned interconnections 210. That is, while in the first embodiment the distance between adjacent LED chips 121 should be set at Dp that is determined according to FIG. 3 and Equation (4), in the third embodiment the distance between adjacent LED chips 121 can be set at 2·Dp. This makes it possible to secure a space for necessary patterned interconnections 210, and to provide a linear light source that produces a uniform exposure profile and is superior in efficiency of light utilization.

Fourth Embodiment

Figure 8:
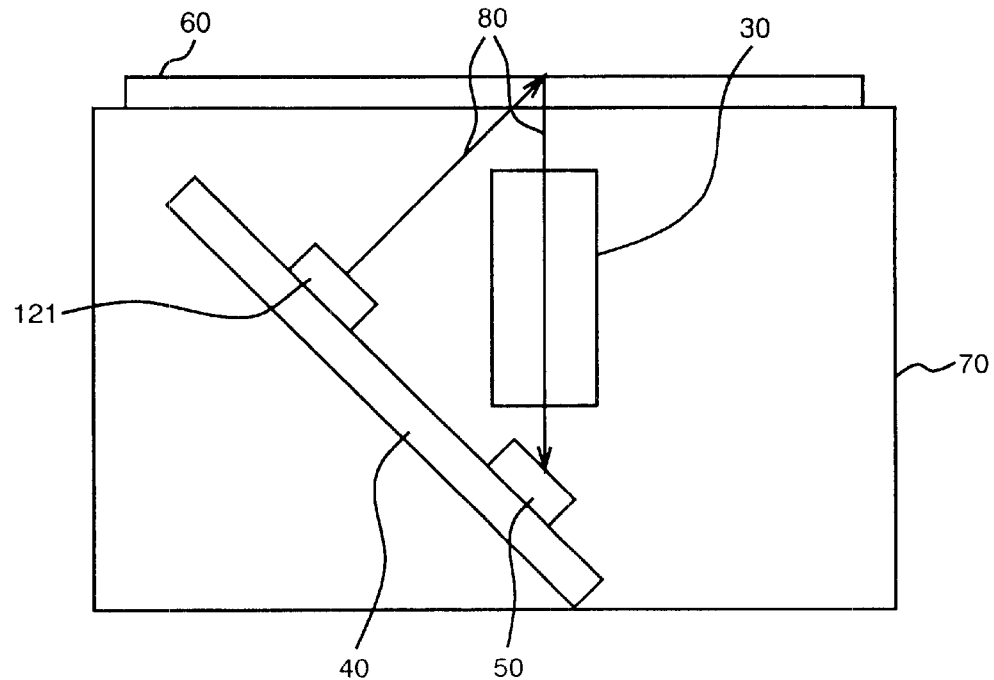
FIG. 8 shows a structure of a contact image sensor according to a fourth embodiment of the present invention.
Figure 9:
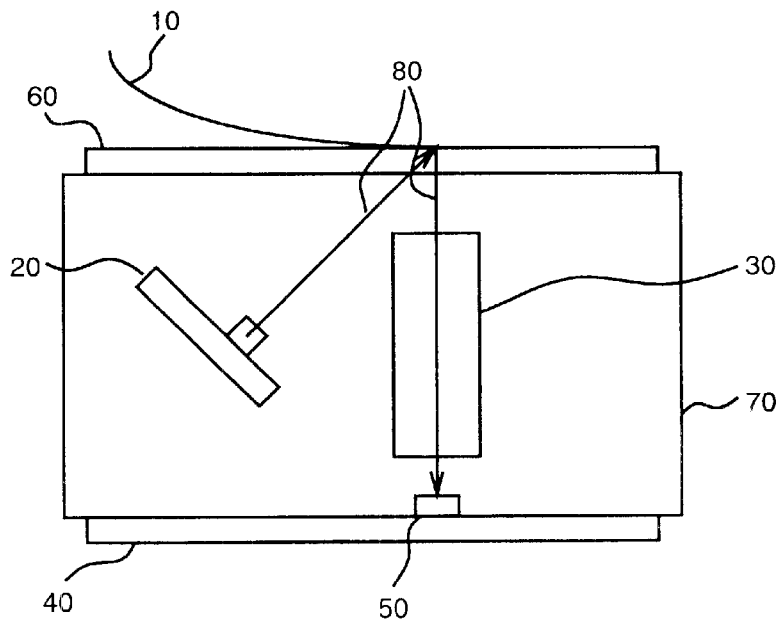
FIG. 9 is a sectional view of conventional contact image sensor.
Figure 10:
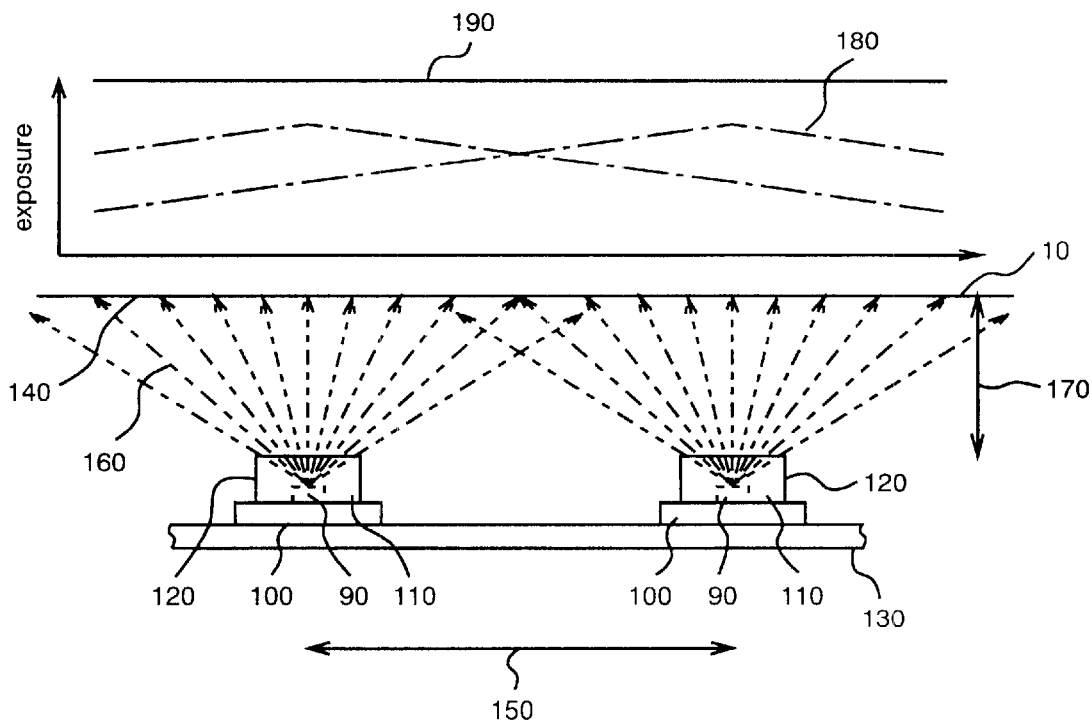
FIG. 10 shows a linear light source of the conventional contact image sensor.

Next, a fourth embodiment of the invention will be described with reference to FIG. 8. In FIG. 8, reference numeral 30 denotes an erect 1:1 imaging rod lens array, or an erect-image, equi-magnification imaging rod lens array, that is composed of a plurality of rod lenses (not shown); 40, a sensor board; 50, sensor ICs attached to the sensor board 40 so as to be arranged linearly; 121, LED chips attached to the sensor board 40 so as to be arranged at intervals that were described in the first embodiment; 60, a glass plate on a document running surface; 70, a sensor frame; and 80, a path of light that is output from the LED chips 121 and imaged on the sensor ICs 50.

In the fourth embodiment, the LED chips 121 are provided on the sensor board 40, that works as a common base board. That is, instead of using a circuit board dedicated to the mounting of the LED chips 121, a circuit board for mounting of the LED chips 121 is commonly used with the sensor board 40. This makes it possible to reduce the size of the contact image sensor.

The features and the effects of the present invention as described above may be summarized as follows.

According to one aspect of the present invention, LED chips each having sharp directivity characteristic are used, and the mounting pitch of the LED chips is set according to the directivity characteristic of each LED chip and Equation (4). Therefore, a uniform exposure characteristic is obtained in the LED chip mounting direction, and a light condensing effect is obtained in the direction perpendicular to the LED chip mounting direction. This makes it possible to provide a linear light source that is superior in efficiency of light utilization.

In another aspect, the mounting pitch of the lens-associated LED chips 121 is properly set to be smaller than the distance from the lens-associated LED chips 121 to the exposure surface, i.e. the document surface. As a result, a uniform exposure characteristic is obtained in the mounting direction of the lens-associated LED chips 121, and a lens effect is obtained in the direction perpendicular to the mounting direction. Thus, a linear light source that is superior in efficiency of light utilization can be provided.

In another aspect, a linear light source is configured in such a manner that holes are formed through an LED board, and LED chips having sharp directivity characteristic are mounted from the back side of the LED board. Therefore, the number of LED chips can be reduced and an efficient, inexpensive light source can be provided.

In another aspect, two linear light sources of a contact image sensor are disposed so as to be symmetrical with respect to a rod lens array, and LED chips having sharp directivity characteristic are so arranged that each LED chip of one linear light source is located at a position that is symmetrical with the middle point between adjacent LED chips of the other linear light source. Therefore, equivalently, the interval between the LED chips having sharp directivity characteristic can be halved. This makes it possible to form necessary patterned interconnections, and to provide a linear light source that produces a uniform exposure profile and is superior in efficiency of light utilization.

Further in another aspect, common use of a sensor board with a circuit board for mounting of LED chips makes it possible to reduce the size of the contact image sensor.

Obviously many modifications and variations of the present invention are possible in the light of the above teachings. It is therefore to be understood that within the scope of the appended claims the invention may by practiced otherwise than as specifically described.

The entire disclosure of a Japanese Patent Application No. 11-287134, filed on Oct. 7, 1999 including specification, claims, drawings and summary, on which the Convention priority of the present application is based, are incorporated herein by reference in its entirety.

What is claimed is:

1. A linear light source comprising:

a circuit board; and a plurality of LED chips arranged linearly on said circuit board, each of said LED chips having a light condensing function built into the chip, wherein said plurality of LED chips are arranged so as to maximize efficiency of usage of light emitted by said LED chips while maintaining a uniform light exposure profile for said linear arrangement.

2. The linear light source according to claim 1, wherein each of said LED chips is provided with a lens which provides said light condensing function.

3. The linear light source according to claim 1, wherein an arrangement interval between adjacent LED chips is shorter than or equal to a distance between said arrangement of LED chips and an exposure surface of an object illuminated by said linear light source.

4. The linear light source according to claim 3, wherein a ratio between the interval of the adjacent LED chips and the distance from said LED chips to said exposure surface is determined according to a directivity characteristic of each of said LED chips and an equation $$L(\theta)=L(0°)/(2\cdot\cos^2\theta)$$

where $L(\theta)$ is exposure at an angle $\theta$, and $\theta$ is an angle with respect to a perpendicular direction to said exposure surface from said LED chips.

5. The linear light source according to claim 1, wherein said circuit board has holes through which said LED chips are mounted from the back side thereof, and wherein light from said LED chips is emitted to a front side of said circuit board.

6. A contact image sensor comprising:

an erect 1:1 imaging lens;

a pair of linear light sources in which LED chips are mounted, the linear light source being disposed on both sides of the erect 1:1 imaging lens so as to be parallel with each other and symmetrical with respect to the erect 1:1 imaging lens; and sensor ICs for receiving, via said erect 1:1 imaging lens, light beams that are emitted from said linear light sources and then reflected by a document surface, wherein each of said linear light sources is the linear light source according to claim 1, and each LED chip of one linear light source is located at a position that is symmetrical with a middle point between adjacent LED chips of the other linear light source or a point close to the middle point.

7. A contact image sensor comprising:

an erect 1:1 imaging lens;

a linear light source in which LED chips are mounted; and sensor ICs for receiving, via said erect 1:1 imaging lens, light that is emitted from said linear light source and then reflected by a document surface, wherein said linear light source is the linear light source according to claim 1, and said linear light source and said sensor ICs are mounted on a common base board.

* * * * *